United States Patent
Oyamada

(10) Patent No.: US 8,243,245 B2
(45) Date of Patent: Aug. 14, 2012

(54) BSC MACROSTRUCTURE FOR THREE-DIMENSIONAL WIRING AND SUBSTRATE HAVING THE BSC MACROSTRUCTURE

(75) Inventor: Seisei Oyamada, Tokyo (JP)

(73) Assignee: Liquid Design Systems Inc., Yokohama, Kanagawa (JP)

( * ) Notice: Subject to any disclaimer, the term of this patent is extended or adjusted under 35 U.S.C. 154(b) by 699 days.

(21) Appl. No.: 12/077,179

(22) Filed: Mar. 17, 2008

(65) Prior Publication Data
US 2009/0235135 A1    Sep. 17, 2009

(51) Int. Cl.
*G02F 1/1345* (2006.01)
*G01R 31/28* (2006.01)
(52) U.S. Cl. .................. 349/149; 349/151; 714/727
(58) Field of Classification Search ............ 349/149; 714/726, 727
See application file for complete search history.

(56) References Cited

U.S. PATENT DOCUMENTS

| 5,983,377 | A * | 11/1999 | Knotts | 714/726 |
| 6,734,549 | B2 | 5/2004 | Takeoka et al. | |
| 2002/0194564 | A1* | 12/2002 | Tsujii et al. | 714/727 |
| 2003/0146763 | A1* | 8/2003 | Sunter | 324/527 |
| 2004/0008314 | A1* | 1/2004 | Hayashi et al. | 349/158 |

FOREIGN PATENT DOCUMENTS

| JP | 8101255 | 4/1996 |
| JP | 09-139409 | 5/1997 |
| JP | 2001168273 | 6/2001 |
| JP | 2003014819 | 1/2003 |
| JP | 2004069650 | 3/2004 |

\* cited by examiner

*Primary Examiner* — Richard Kim
*Assistant Examiner* — David Chung
(74) *Attorney, Agent, or Firm* — Collard & Roe, P.C.

(57) ABSTRACT

A BSC macrostructure for three-dimensional wiring includes a BSC (boundary scan cell) and an aperture electrode for electrode connection which is connected to the BSC.

8 Claims, 6 Drawing Sheets

BSC MACROSTRUCTURE FOR THREE-DIMENSIONAL WIRING AND SUBSTRATE HAVING THE BSC MACROSTRUCTURE

BACKGROUND OF THE INVENTION

This invention relates to a BSC macrostructure for three-dimensional wiring and a substrate having the BSC macrostructure and, in particular, to a BSC macrostructure for three-dimensional wiring, which is effective when a boundary scan test is performed, and a substrate having the BSC macrostructure.

A boundary scan test defined by IEEE 1149.1 is widely spread in the electronics industry. The boundary scan test is a testing method in which boundary scan cells (hereinafter referred to as "BSCs") are arranged around an LSI so as to perform scanning. According to the boundary scan test, it is easy to test a printed board having a plurality of LSIs and to test a multi-chip module (MCM) (for example, see Japanese Unexamined Patent Application Publication (JP-A) No. H9-139409).

In order to perform the boundary scan test, is known a method which uses a BSC buffer included in a special-purpose or a general-purpose switch array or bi-directional driver IC. Referring to FIG. 1, description will be made of the method of performing the boundary scan test by the use of the BSC buffer. In the figure, a substrate 100 is provided with a plurality of I/O pads 101 for external connection and a plurality of pads 102 for mounting bare chips 110 and 120. The bare chip 110 has a plurality of pads 111. Similarly, the bare chip 120 has a plurality of pads 121. The pads 111 and 121 of the bare chips 110 and 120 are connected to the pads 102 of the substrate 100 by wire bonding using bonding wires 140.

When the boundary scan test is performed, a plurality of BSC buffers 103 are arranged on the substrate 100. Under control of a TAP controller 130, the boundary scan test is performed.

SUMMARY OF THE INVENTION

However, the conventional method described above is disadvantageous in the following respect. When a plurality of LSIs are mounted in a single package or module, the BSC buffers 103 must be arranged at all of input and output points of the LSIs. Therefore, the number of parts is inevitably increased. This results in an increase in system size and system cost.

In view of the above, it is an object of this invention to provide a BSC macrostructure for three-dimensional wiring, which allows a boundary scan test to be performed with a low-cost structure without increase in system size, and to provide a substrate having the BSC macrostructure.

According to this invention, there is provided a BSC macrostructure for three-dimensional wiring, comprising at least one BSC (boundary scan cell); and at least one aperture electrode for electrode connection, which is connected to the BSC and formed on one or both sides of the BSC.

Preferably, two BSCs are connected to each other and each of the BSCs is connected to at least one aperture electrode.

Preferably, the aperture electrode is connected to an electrode of an integrated circuit by wire bonding or by using a bump.

Preferably, the BSC macrostructure for three-dimensional wiring is mounted to a substrate.

According to this invention, there is provided a BSC macrostructure for three-dimensional wiring, comprising at least one BSC (boundary scan cell); and at least one aperture electrode for electrode connection, which is connected to the BSC and formed on one or both sides of the BSC. Therefore, it is possible to provide a BSC macrostructure for three-dimensional wiring, which allows a boundary scan test to be performed with a low-cost structure without increase in system size, and to provide a substrate having the BSC macrostructure.

DESCRIPTION OF THE EXEMPLARY EMBODIMENT

Figure 1:
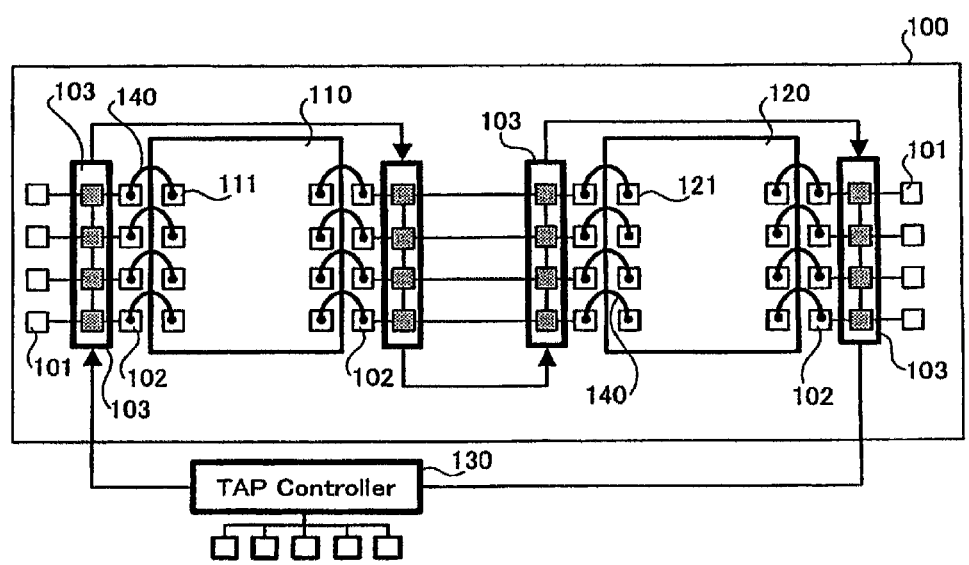
FIG. 1 is a view for describing a conventional technique.

Now, an exemplary embodiment of this invention will be described with reference to the drawing.

Figure 2A:
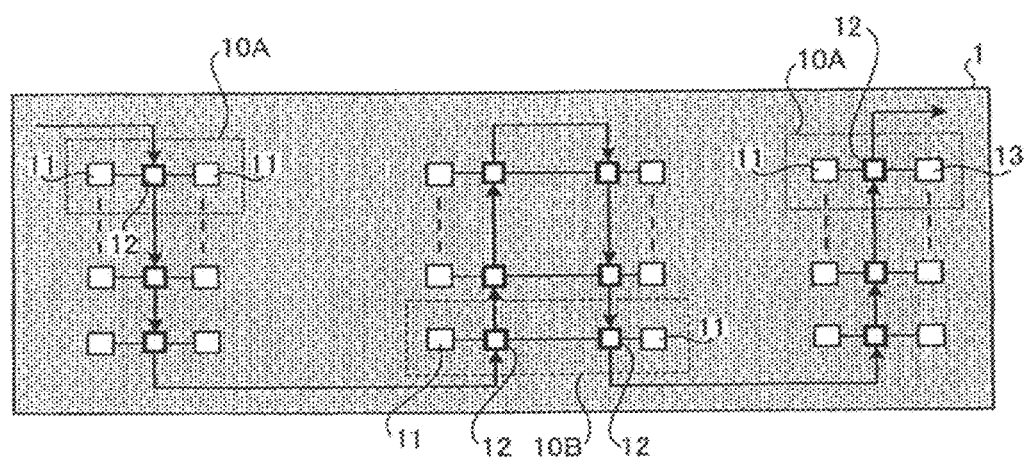
FIG. 2A is a plan view of a substrate having BSC macrostructures for three-dimensional wiring according to an embodiment of this invention.
Figure 2B:
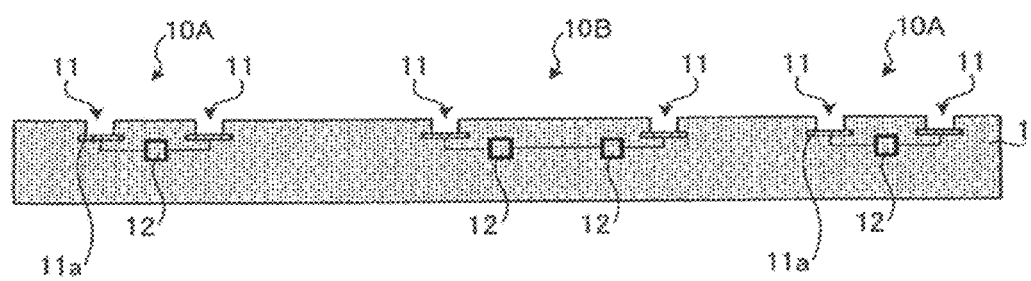
FIG. 2B is a sectional view of the substrate illustrated in FIG. 2A.

Referring to FIGS. 2A and 2B, a substrate 1 may be an Si substrate, a glass substrate or a plastic substrate suitable for use with an organic EL element or a liquid crystal element mounted thereto, a printed board, or the like. The substrate 1 is provided with a plurality of BSC macrostructures 10A and 10B for three-dimensional wiring (for brevity of description, will simply be referred to as "BSC macrostructures" hereinafter).

Each of the BSC macrostructures 10A has a BSC 12 formed inside the substrate 1 and a pair of aperture electrodes 11 each having a generally square shape and connected to the BSC 12. Each of the BSC macrostructures 10B has a pair of BSCs 12 formed inside the substrate 1 and a pair of aperture electrodes 11 each having a generally square shape and connected to the BSCs 12, respectively. The BSCs 12 of the BSC macrostructures 10A and 10B are connected in series to form a daisy chain. Each of the aperture electrodes 11 is provided with a pad 11a formed at its bottom to be connected to a bare chip by a bonding wire or a bump.

Each of the BSC macrostructures 10A is a macrocell for external connection. The aperture electrodes 11 of the BSC macrostructures 10A are used for connection with I/O wires and connection with bare chips. Each of the BSC macrostructures 10B is a macrocell for internal connection. The aperture electrodes 11 of the BSC macrostructures 10B are used for connection with bare chips.

Figure 3A:
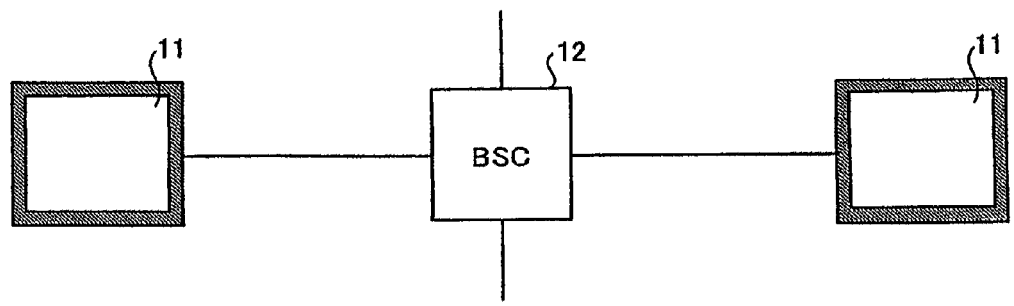
FIGS. 3A and 3B show the BSC macrostructures for three-dimensional wiring.
Figure 3B:
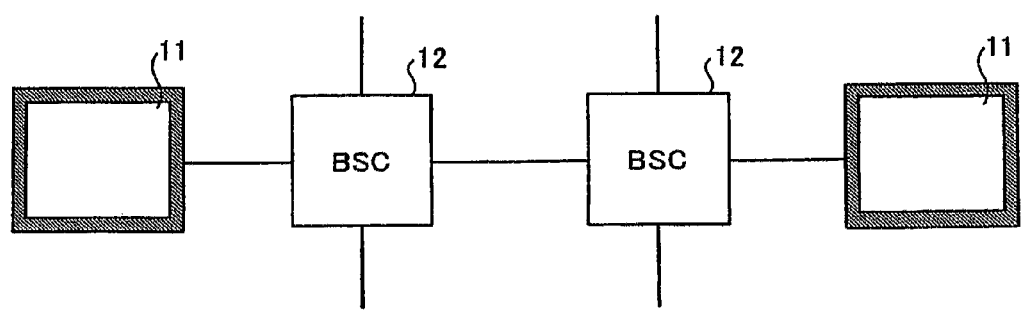

Referring to FIG. 3A, each of the BSC macrostructures 10A has a structure in which the BSC 12 is arranged at its center and connected to the aperture electrodes 11 on both sides thereof. Referring to FIG. 3B, each of the BSC macrostructures 10B has a structure in which the two BSCs 12 are connected to each other and connected to the two aperture electrodes 11, respectively.

Next referring to FIGS. 4A and 4B, description will be made of the case where bare chips 20 and 30 are mounted to the substrate 1 and a boundary scan test is performed.

Figure 4A:
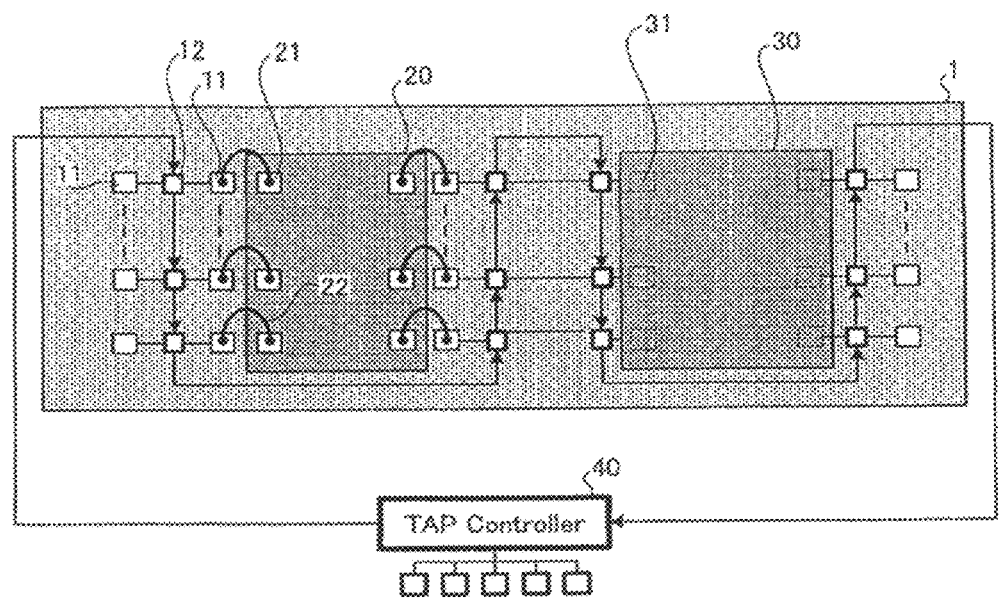
FIG. 4A is a plan view of the substrate in FIG. 2A when bare chips are mounted thereon.
Figure 4B:
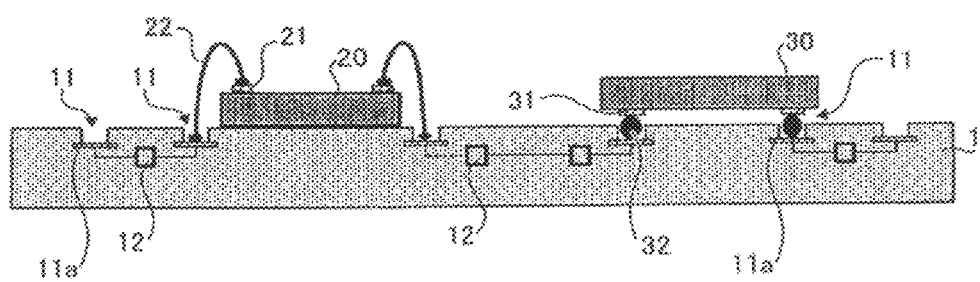
FIG. 4B is a sectional view of the substrate illustrated in FIG. 4A.

As illustrated in FIGS. 4A and 4B, the bare chip 20 has a plurality of pads 21 formed at the outer periphery of its top surface. The bare chip 30 has a plurality of pads 31 and a plurality of bumps 32 formed at the outer periphery of its bottom surface.

The pads 21 of the bare chip 20 and the pads 11a of the aperture electrodes 11 formed on the substrate 1 are connected to each other by wire bonding using bonding wires 22. The pads 31 of the bare chip 30 and the pads 11a of the aperture electrodes 11 are connected to each other by reflowing the bumps 32. Thus, the bare chips 20 and 30 can be directly connected to (or plugged in) the aperture electrodes 11 by the wire bonding or by using the bumps.

In order to perform the boundary scan test, a TAP controller 40 is connected to the BSCs 12.

As described above, the BSC macrostructures 10A and 10B according to the embodiment include the BSCs 12, and the aperture electrodes 11 for electrode connection which are connected to the BSCs 12 and formed on one or both sides of the BSCs 12. Therefore, the boundary scan test can be performed with a low-cost structure without increase in system size.

First Modification

Figure 5A:
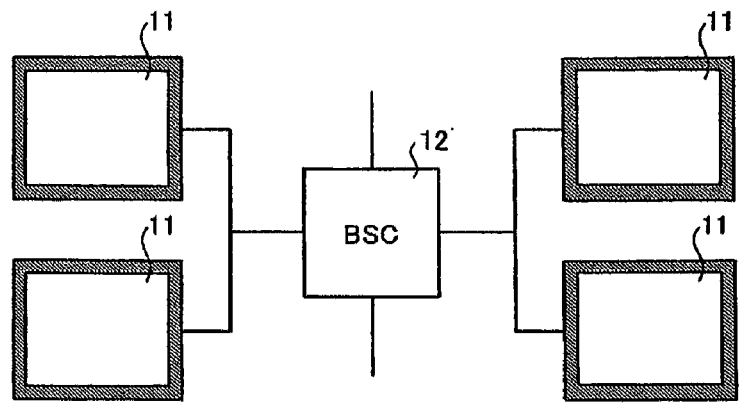
FIGS. 5A and 5B show modifications of the BSC macrostructures illustrated in FIGS. 3A and 3B.
Figure 5B:
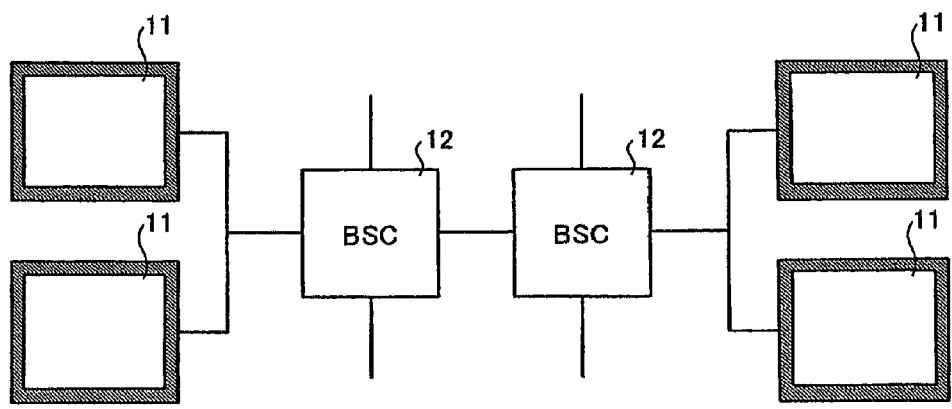

In the BSC macrostructures 10A and 10B according to the above-mentioned embodiment, a single one of the aperture electrodes 11 is connected to each side or one side of the BSC 12. However, this invention is not limited thereto. For example, as illustrated in FIGS. 5A and 5B, a plurality of aperture electrodes 11 may be connected to each side or one side of the BSC 12.

Second Modification

Figure 6:
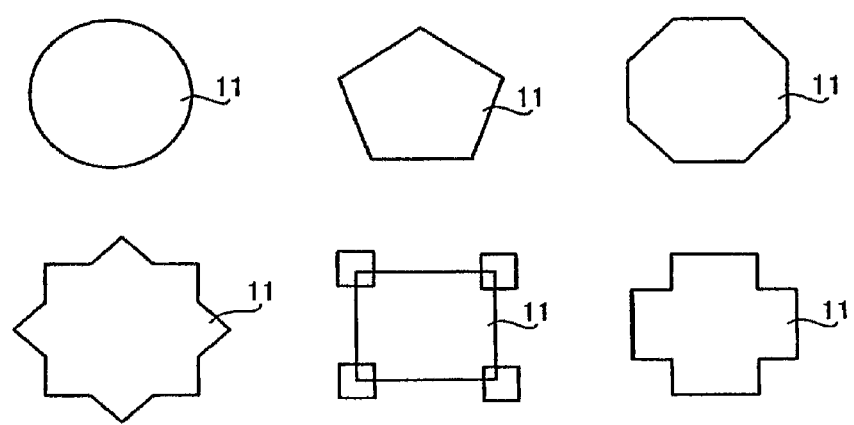
FIG. 6 shows modifications of the shape of an aperture electrode of the BSC macrostructure for three-dimensional wiring.

In the BSC macrostructures 10A and 10B according to the above-mentioned embodiment, the aperture electrode 11 has a generally square shape. However, this invention is not limited thereto. For example, the aperture electrode 11 may have various shapes illustrated in FIG. 6.

The BSC macrostructure for three-dimensional wiring and the substrate having the BSC macrostructure according to this invention is widely applicable to various systems to be subjected to a boundary scan test.

Although this invention has been described in conjunction with the exemplary embodiment thereof, this invention is not limited to the foregoing embodiment but may be modified in various other manners within the scope of the appended claims.

What is claimed is:

1. A BSC macrostructure for three-dimensional wiring, comprising:
    a substrate;
    a plurality of boundary scan cells (BSCs) embedded within the substrate; and
    at least one aperture electrode electrically connected to at least one side of each boundary scan cell and placed within an aperture of the substrate;
    wherein each aperture electrode has a pad placed at a bottom of the aperture; and
    wherein each BSC is connected in series to form a daisy chain within the substrate.

2. The BSC macrostructure according to claim 1, wherein two BSCs are connected to each other and each of the BSCs is connected to at least one aperture electrode.

3. The BSC macrostructure according to claim 1, wherein the at least one aperture electrode is connected to an electrode of an integrated circuit by wire bonding or by using a bump.

4. The BSC macrostructure according to claim 1, wherein the substrate is selected from the group consisting of a Si substrate, a glass substrate, a plastic substrate, and a print substrate.

5. A semiconductor device comprising:
    a substrate;
    a plurality of boundary scan cells embedded within the substrate;
    at least one aperture electrode electrically connected to at least one side of each boundary scan cell and placed within an aperture of the substrate;
    wherein each aperture electrode has a pad placed at a bottom of the aperture; and
    wherein each boundary scan cell is electrically connected in series to form a daisy chain within the substrate.

6. The semiconductor device according to claim 5, further comprising:
    at least one bare chip having a plurality of pads or bumps electrically connected to the at least one pad of the at least one aperture electrode.

7. The semiconductor device according to claim 5, wherein the boundary scan cells include a boundary scan cell which is electrically connected to another one of the boundary scan cells on one side within the substrate and which is electrically connected to a plurality of the aperture electrodes within the substrate.

8. The semiconductor device according to claim 5, wherein the boundary scan cells include a boundary scan cell which is electrically connected to a plurality of aperture electrodes arranged on both sides of the boundary scan cell within the substrate.

* * * * *